United States Patent [19]

Lin et al.

[11] Patent Number: 5,686,745
[45] Date of Patent: Nov. 11, 1997

[54] THREE-TERMINAL NON-VOLATILE FERROELECTRIC/SUPERCONDUCTOR THIN FILM FIELD EFFECT TRANSISTOR

[75] Inventors: He Lin, Dallas; Alex Ignatiev; Nai Juan Wu, both of Houston, all of Tex.

[73] Assignee: University of Houston, Houston, Tex.

[21] Appl. No.: 492,431

[22] Filed: Jun. 19, 1995

[51] Int. Cl.$^6$ .............. H01L 29/76; H01L 29/94; H01L 31/062; H01L 31/113
[52] U.S. Cl. .............................................. 257/295
[58] Field of Search ................................... 257/295

[56] References Cited

U.S. PATENT DOCUMENTS

| | | |
|---|---|---|
| 3,832,700 | 8/1974 | Wu et al. |
| 5,155,658 | 10/1992 | Inam et al. |
| 5,168,420 | 12/1992 | Ramesh et al. |

OTHER PUBLICATIONS

J. Mannhart et al., "Influence of Electric Fields on Pinning in $YBA_2ACU_3O_{7-x}$ Films", 67 Phys. Rev. Lett. 2099–2101 (Oct. 1991).

X. Xi et al., "Electric Field Effect in a High Tc Superconducting Ultrathin YBA2Cu3O7–X Films", 59 Appl. Phys. Lett 3470–3472 (Dec. 1991).

F.P. Gnadinger & D.W. Bondurant,"Ferroelectrics for Non-volatile RAMs," IEEE Spectrum 30–33, (Jul., 1989).

J.F. Scott & C.A. Paz de Araujo, "Ferroelectric Memories," 246 Science 1400–1405 (Dec. 1989).

S.Y. Wu, "Memory Retention and Switching Behavior of Metal–Ferroelectric–Semiconductor Transistors," 11 Ferroelectrics 379–383 (1976).

H. Buhay et al., "Pulsed Laser Deposition and Ferroelectric Characterization of Bismuth Titanate Films," 58 Appl. Phys. Lett. 1470–1472 (Apr. 1991).

T.A. Rost et al., "Ferroelectric Switching of a Field–Effect Transistor with a Lithium Niobate Gate Insulator," 59 Appl. Phys. Lett. 3654–3656 (Dec. 1991).

V.V. Lemanov et al., "Ferroelectric–Superconductor Structures with Electric–Field–Controlled Memory", 18 Sov. Tech. Phys. Lett 494–495 (Aug. 1992).

N.J. Wu et al., "Heterostructures of $PB(ZR_xTi_{1-x})O_3$ and YBa2Cu3O7–X on MgO Structure Prepared by Pulsed Laser Ablation," 32 Jpn. J. Appl. Phys. 5019–5023 (Nov. 1993).

N.J. Wu et al., H. LIN, K. Xie, X. Y. LI and A. Ignatiev, "A Comparison Study of (100) and (110) $BA_{0.5}SR_{0.5}TIO_3$ Epitaxial Thin Films Grown on Superconducting YBA2CU3O7–X Thin Film Substrates," C232 Physica 151–157 (1994).

N.J. Wu et al., "Study of $BA_{1-x}SR_xTiO_3(100)$ Epitaxial Thin Films Preared by Laser Deposition," IEEE Spectrum 464–467 (1995).

(List continued on next page.)

*Primary Examiner*—Stephen Meier
*Attorney, Agent, or Firm*—Hutcheson & Grundy, L.L.P.

[57] ABSTRACT

A three-terminal non-volatile ferroelectric/superconductor thin film field effect transistor (FsuFET). The FSuFET is used as a non-volatile memory storage device that provides two static states and four transient states. The FSuFET includes a superconducting film epitaxially grown on a substrate layer. A ferroelectric thin film is then epitaxially grown on the superconducting layer to form the gate of the FSuFET. A drain electrode and a source electrode are then contacted to the superconducting film on either side of the ferroelectric gate. In static mode, the two polarization states of the ferroelectric gate correspond to the binary "0" and "1" states, which are switched by applying a voltage pulse of sufficient magnitude. In transient mode, the four states depend upon the polarization state of the ferroelectric gate and the conductive state (superconducting or non-superconducting) of the drain-source channel. The four states are generated at the drain of the FSuFET and consist of a positive, high pulse; a positive, low pulse; a negative, high pulse; and a negative, low pulse.

22 Claims, 4 Drawing Sheets

OTHER PUBLICATIONS

He Lin et al., "Ferroelectric Switching and Fatigue Behavior for PZT/YBCO Thin Film Heterostructures," 5 Integrated Ferroelectrics 197–202 (1994).

W.K. Chu et al., "Radiation Effects of High–Tc Superconductors," B59/60 Nuclear Instr. and Meth. in Phys. Res. 1447–1457 (1991).

He Lin et al., "The Transient Behavior and Memory Effect of a $PBZR_xTI_{1-x}O_3/YBA_2CU_3O_{7-x}$ Three–Terminal Device", 65 Appl. Phys. Lett. 953–955 (Aug. 1994).

N.J. Wu et al., "PZT/YBCO Integration and Characterization of a Three Terminal Device" 156 Ferroelectrics & Related Mater. 73–78 (Jun. 1994).

X.X. Xi et al., "Voltage–Current Characteristics of a High $T_c$ Superconducting Field Effect Device," 61 Appl. Phys. Lett. 2353–2355 (Nov. 1992).

Shu–Yau Wu, "A New Ferroelectric Memory Device, Metal–Ferroelectric–Semiconductor Transistor," ED–21 IEEE Transactions on Electron Devices 499–504 (Aug. 1974).

J. Mannhart, "High–$T_c$ Three Terminal Devices," Workshop on RIS Josephson Junctions and Three–Terminal Devices, Netherlands, 1–8 (May 1994).

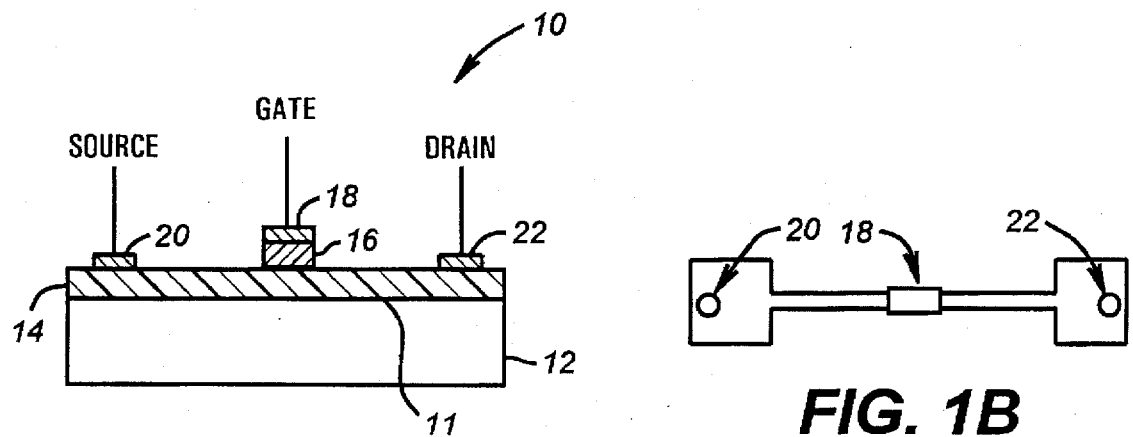
FIG. 1A
FIG. 1B
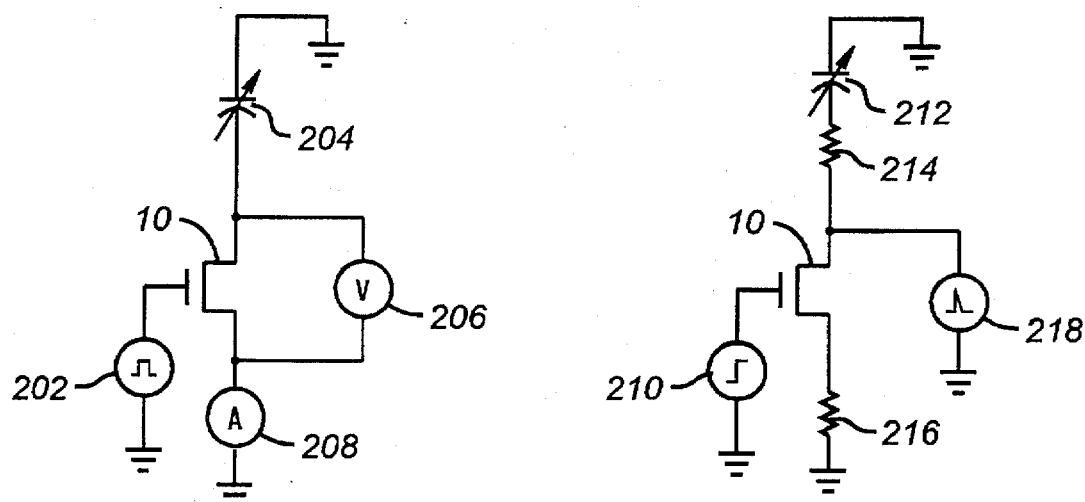
FIG. 2A
FIG. 2B

THREE-TERMINAL NON-VOLATILE FERROELECTRIC/SUPERCONDUCTOR THIN FILM FIELD EFFECT TRANSISTOR

SPECIFICATION

STATEMENT OF RIGHTS

Work for this invention was funded in part by the National Aeronautics & Space Administration under contract number NAGW-977. The Government may have certain rights in this invention.

BACKGROUND OF THE INVENTION

1. Field of the Invention

The present invention relates to field effect transistors, and more particularly, to a ferroelectric/superconductor thin film field effect transistor used as a non-volatile memory.

2. Description of the Related Art

The development of novel three-terminal superconducting electronic devices has been a great interest for many years due to the promise of high speed, high density, and low power consumption of the device. With the onset of high-$T_c$ superconductors, a three-terminal device, identified as a superconducting field effect transistor (SuFET), based on $YBa_2Cu_3O_{7-x}$(YBCO) and a dielectric gate was developed, as described in J. Mannhart et al , "Influence of Electric Fields on Pinning in $YBa_2Cu_3O_{7-x}$ Films," 67 Phys. Rev. Lett. 2099 (1991); and X. X. Xi et al., "Electric Field Effect in High $T_c$ Superconducting Ultrathin $YBa_2Cu_3O_{7-x}$ Films, " 59 Appl Phys. Lett. 3470 (1991). In a SuFET, the charge density of an ultrathin superconducting YBCO channel is modulated by applying a voltage across a compatible dielectric layer, such as $SrTiO_3$ or MgO, deposited between a gate electrode and the superconducting film. The SuFET, however, is a volatile device, i.e., the state of the transistor is not maintained when power is removed. In addition, the SuFET exhibits low speed and low gain.

Ferroelectric memories are used to achieve non-volatility. The defining characteristic of ferroelectricity is the existence of a spontaneous polarization state and accompanying polarization electric field, the orientation of which can be switched by an applied electric field. Ferroelectric memories based on ferroelectric capacitors operate on the basis of localized polarization switching of microscopic regions in ferroelectric thin films. The polarization state is then equated to a binary value of 0 or 1. Such a memory device is nonvolatile because the switched region of the thin film remains in its polarization state when the voltage is removed. Another attribute of ferroelectric thin film materials as applied to non-volatile logic such as mass memories is their potential for radiation hardness, which allows for the operation of electronic circuitry in the radiation-rich space environment.

As described in F. P. Gnadinger & D. W. Bondurant, "Ferroelectrics for Nonvolatile RAMs," IEEE Spectrum 30 (Jul. 1989), and J. F. Scott & C. A. Paz de Araujo, "Ferroelectric Memories," 246 Science 1400 (1989), ferroelectric capacitor memories are typically formed by depositing, using a sputtering or a sol-gel process, ferroelectric materials onto a metallic bottom electrode. A top metal electrode is then deposited by sputtering or evaporation over the ferroelectric thin film. These capacitor ferroelectric memory cells exhibit reduced performance in the form of memory cell aging and fatigue due to the atomically poor interface quality and the polycrystalline structure of the ferroelectric materials.

More recently, U.S. Pat. No. 5,155,658 to Inam et al. describes ferroelectric memory devices including lead zirconate titanate, $Pb(Zr_xTi_{1-x})O_3$ (PZT), expitaxially deposited on a film of YBCO. In addition, U.S. Pat. No. 5,168,420 to Ramesh et al. describes a ferroelectric storage element made of a thin ferroelectric film such as bismuth titanate, $Bi_4Ti_3O_4$, epitaxially grown on a perovskite crystalline substrate such as $Bi_2Sr_2CuO_{6+x}$. In both Inam and Ramesh, ferroelectric films are expitaxially deposited on cuprate superconducting films. The Inam and Ramesh devices show improved properties such as enhanced fatigue and retention characteristics. They have also shown that the memory can be rejuvenated after it has become fatigued by applying a pulse having magnitude equal to that of the writing pulse but of considerably longer duration. However, such a simple ferroelectric capacitor memory element would require a relatively complicated series of electronic gates to allow for reading or writing in a memory matrix.

Another disadvantage of prior art memory storage devices is that transistors exhibiting no hysteresis behavior are combined into a circuit that does exhibit hysteresis behavior. Memory function is then a property of the circuit, thereby requiring many elements to achieve a single bit storage.

The conductivity of a semiconductor substrate modulated by a ferroelectric material has been studied. Deposition of ferroelectric layers, such as $Bi_4Ti_3O_{12}$ and $MgF_2$, onto n- or p- type silicon substrates produces a metal-ferroelectric silicon field effect transistor (MFSFET) device, which exhibits stable memory storage characteristics. Ideally, this device operates through attraction of electrons or holes to the semiconductor interface caused by the remanent polarization field in the switched ferroelectric film. This creates a conductive channel (inversion layer) or an accumulation layer at the semiconductor surface, which corresponds to the ON and OFF conditions, respectively. Although there is potential advantage of this device for memory applications, research has shown that modeling the interface between the ferroelectric and semiconductor is relatively complicated. The studies have found that the change in surface conductivity of the silicon is opposite to that expected for ferroelectric switching. This is due to electrons in the semiconductor being injected into the ferroelectric film, which changes the polarity of the charge near the semiconductor surface. Recently, as described in T. A. Rost et al., "Ferroelectric Switching of a Field-Effect Transistor with a Lithium Niobate Gate Insulator," 59 Appl. Phys. Lett. 3654 (1991), a ferroelectric $LiNbO_3$ gate layer is used in a MFSFET. The parameters of this device are altered in a direction of hysteresis loop which is consistent with ferroelectric switching being the dominant effect. However, the interface problem between $LiNbO_3$ and Si creates serious fatigue effects and reduced retention properties of the device.

Polarization-induced change of superconductive properties and the initial idea of a polarization-field-controlled superconductor conductivity was proposed by V. V. Lemanov, et al., "Ferroelectric-Superconductor Structures with Electric-Field-Controlled Memory," 18 Sov. Tech. Phys. Lett. 494 (1992). The ferroelectric-superconductor structure described in Lemanov was tested on a bulk ferroelectric crystal, such as ($LiNbO_3$ and $BaTiO_3$), with a YBCO film and source and drain electrodes deposited over the YBCO film on either side of the ferroelectric plate. A metal gate electrode was deposited on top of the ferroelectric plate. Both the channel superconducting transition temperature and its resistance were affected by gate polarization reversal. The component configuration of the Lemanov device is, however, incompatible with large-scale integration because of the use of bulk ferroelectric crystals, and because it requires operational voltages considerably higher than those used with semiconductor integrated circuits. Like the SuFETs described in Mannhart et al. and Xi et al., Lemanov also requires use of ultrathin superconductor films having a thickness of 1–2 lattice constants.

SUMMARY OF THE PRESENT INVENTION

In accordance with the present invention, a non-volatile memory device which includes a ferroelectric/ superconducting field effect transistor (FSuFET) is provided which utilizes the remanent polarization field of a ferroelectric thin film to control the conductivity of a superconducting thin film and perform the memory function.

The superconducting thin film is epitaxially grown on a substrate. The superconducting film is a relatively thick layer that forms a thick channel region. Next, a ferroelectric thin film is grown on the superconducting thin film to form the gate of the FSuFET. A gate electrode is placed over the ferroelectric layer. In addition, electrodes are contacted to the superconducting film on either side of the gate electrode to form the drain and source contacts. Two memory modes are provided by the memory device according to the present invention: a static memory mode and a transient memory mode. In static memory mode, the two polarization states of the FSuFET correspond to the "0" and "1" binary states. The remanent electric field created by the polarization in the ferroelectric gate is normal to the direction of the drain-source channel. To switch the direction of the polarization field, a voltage pulse is applied to the gate electrode, which modulates the channel resistance between the drain and source in the FSuFET.

In transient mode, the FSuFET can produce four different states at its drain output in response to an input voltage pulse. The four states are a high, positive pulse; a low, positive pulse; a high, negative pulse; and a low, negative pulse. The four different states depend on the polarization state of the ferroelectric gate and whether the drain-source channel is superconductive or non-superconductive. The high pulses are generated when the channel is superconductive, and the low pulses are generated when the channel is non-superconductive. The drain-source channel can be switched from the superconducting state to the non-superconducting (normal) state by applying a bias current density which when combined with the transient current density in the drain-source channel exceeds the critical current density of the superconductor layer. In addition, the channel can also be switched by applying an external magnetic field which when combined with the transient current density will cause the channel to switch normal. Finally, the channel can be switched normal by increasing the device temperature above the superconducting transition temperature of the channel.

BRIEF DESCRIPTION OF THE DRAWINGS

A better understanding of the present invention can be obtained when the following detailed description of the preferred embodiment is considered in conjunction with the following drawings, in which:

FIG. 1A is a cross-sectional side view of a three-terminal non-volatile perovskite ferroelectric/high-Tc superconductor thin film field effect transistor (FSuFET);

FIG. 1B is a top view of the FSuFET of FIG. 1 showing placement of gold electrodes;

FIG. 2A and 2B are schematic diagrams of circuitry including the FSuFET of FIG. 1 for obtaining test measurements;

DESCRIPTION OF THE PREFERRED EMBODIMENT

Figure 3:
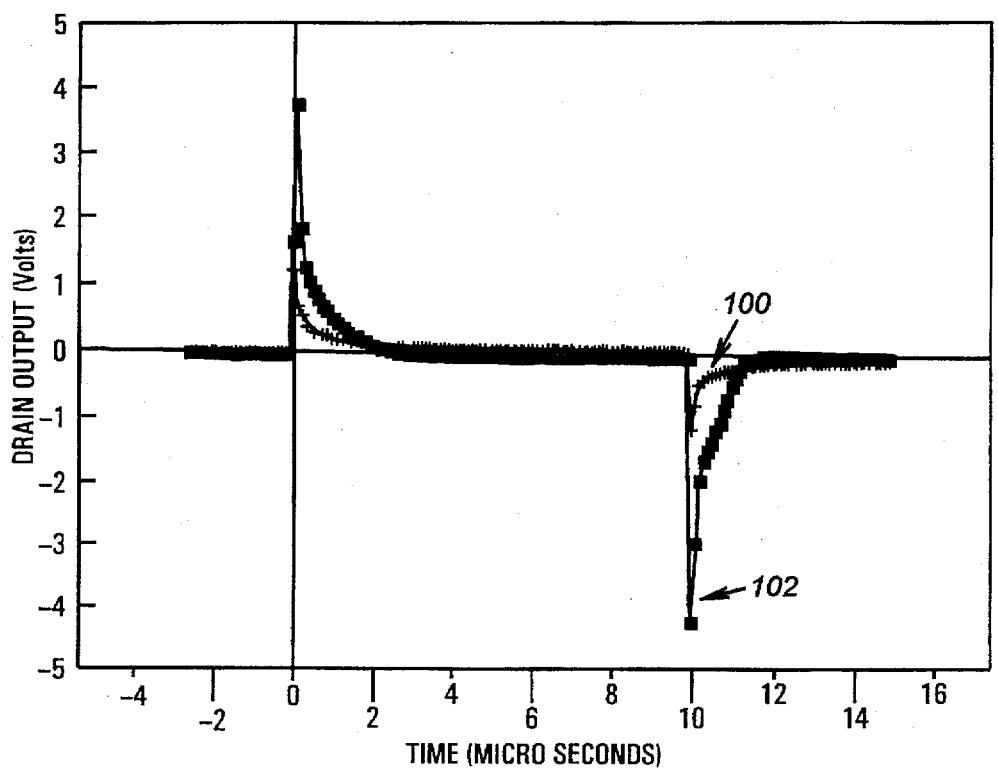
FIG. 3 is a graph illustrating the voltage output at the drain of the FSuFET of FIG. 1 in response to an input pulse.

Referring to FIGS. 1A–B, a non-volatile three terminal thin film FSuFET 10 is shown which includes a thin film ferroelectric gate 16 comprised of a perovskite oxide on a thin film high $T_c$ superconductor base 14 comprised of a perovskite oxide. The FSuFET includes a YBCO base layer 14 and a PZT or BST or other perovskite oxide gate 16. The YBCO layer 14 is deposited by pulsed excimer laser ablation on a MgO (100), LaAlO$_3$ (100), SrTiO$_3$ (100), NdGaO$_3$ (100) or other perovskite substrate 12. Additionally, the substrate 12 can be formed of Si, Ge, InP or GaAs with an appropriately applied buffer layer such as CeO$_2$, ZrO$_2$, Y-stabilized ZrO$_2$, or some thin perovskite oxide. The YBCO film is deposited at a substrate temperature of between 700° C. and 800° C. in an ambient oxygen pressure between 150 to 200 mTorr, but preferably about 200 mTorr. The laser light, such as that generated by a 248-nm KrF excimer laser from Lambda Physics, is focused onto a rotating, sintered polycrystalline target of YBCO, and the resulting plume of ablated YBCO material is directed onto the heated substrate. The YBCO film is patterned using photolithography and ion milling techniques. The PZT layer 16, Pb(Zr$_x$Ti$_{1-x}$)O$_3$, x preferably equal to 0.52, or other perovskite oxide, is then laser deposited from a target on top of the YBCO film at a substrate temperature between 550° C. and 600° C. and an oxygen pressure of between 150 and 250 mTorr. The YBCO film is nominally 100 nm thick, but the thickness can range between about 10 nm and about 200 nm. The PZT layer is nominally 500 nm thick, but can range between about 30 and about 1000 nm. The YBCO film 14 is orthorhombic and oriented with the c-axis normal to the surface 11 of the substrate 12. The PZT film 16 is a perovskite structure with (100) orientation.

The PZT film 16 is patterned following deposition, and gold electrodes having thicknesses ranging between 50 nm and 100 nm are evaporated on top of PZT layer 16 and YBCO layer 14 to form gate electrode 18, source electrode 20, and drain electrode 22. Placement of the gold electrodes 18, 20 and 22 are shown in FIG. 1B. The Au/PZT/YBCO mesa structure is finally defined using photolithography and ion milling processing.

Prior models for field induced current modulation for high $T_c$ superconductor FETs are based on the change in charge carrier density in channels not much wider than the coherence length of the superconductor. For a YBCO superconductor, such an effect is measurable only for a channel that is 2–5 nm thick. As the channel in the present FSuFET 10 is 10 to 200 nm thick, the prior model is not applicable for current modulation in the thick channel according to the present invention.

While not bound by such hypothesis for a thick channel, it is believed that the polarization field affects the electronic properties of pinning centers in the YBCO channel to produce a change in the critical current density ($J_c$). A change in polarization therefore changes the conductivity in the thick YBCO channel.

The relatively thick superconductor channel active in the FSuFET 10 (10 to 200 nm) is one that can be directly fabricated with current thin film growth technologies including laser deposition, sputtering and MOCVD. This is in sharp contrast to the required ultra-thin quality channel required for the operation of the classical SuFET. Extreme thickness control and accuracy is required for the deposition of the 2 nm to 5 nm thick channels required for the SuFET. This is not commensurate with today's thin film manufacturing technology and thus makes the SuFET undesirable. The relatively thick channel for the FSuFET according to the present invention, however, allows for direct fabrication of the device and its ready application in current technology.

The lattice and chemical match between the perovskite ferroelectric thin film gate 16 and the perovskite high $T_c$ superconducting thin film 14 benefits the three-terminal device 10 in the following ways. First, the epitaxial ferroelectric gate 16 can be grown on the perovskite type high $T_c$ superconductor substrate 14 preserving crystallinity and hence enhancing performance. The ferroelectric gate 16 is a highly oriented (100)-$PbZr_xTi_{1-x}O_3$ (PZT), (100)-(Pb,La)(Zr,Ti)$O_3$ (PLZT), (100)-($Ba_{1-x}Sr_x$)$TiO_3$ (BST) or other ferroelectric thin film deposited on the c- or a-axis oriented $YBa_2Su_3O_{7-x}$ by laser ablation, selected such that the polarization of the ferroelectric film 16 is normal to the YBCO surface.

The second advantage is that the chemical match between a perovskite ferroelectric gate such as a $PbZr_xTi_{1-x}O_3$ and a perovskite high $T_c$ superconductor base such as $YBa_2Cu_3O_{7-x}$ results in a chemically stable interface with minimal interdiffusion and a high degree of interface perfection.

Another advantage of the PZT/YBCO structure is that it has low fatigue rates, particularly when temperature is lowered below the $T_c$ critical temperature (approximately 91° Kelvin) of the YBCO layer. Studies done on a PZT/YBCO sample showed that its polarization decreased by approximately 8% after $3 \times 10^8$ cycles at temperatures greater than $T_c$, while the polarization decreased only 2% after the same number of cycles at temperatures less than $T_c$ under extreme stress testing conditions, i.e., full saturation measurements at a modulation frequency of 10 KHz to 40 KHz. Under standard testing conditions (using 5 MHz and 10 volts peak-to-peak square wave modulation), the remanent polarization of the tested PZT/YBCO device operating below $T_c$ showed no fatigue after $10^{12}$ cycles. When operating at above $T_c$, the polarization decreased about 6% after the same number of cycles. This is believed to be related to the lower dielectric loss below $T_c$ and other possible mechanisms that are connected to the interface properties of PZT/YBCO structure.

The FSuFET device 10 is a radiation-hard device in that it is able to withstand significant radiation doses without damage. The FSuFET device 10 can withstand more than 5 Mrads of high-energy X-rays per square centimeter and an intensity of $10^{11}$ rad/(cm$^2$s$^1$), or $10^{14}$ 1-MeV neutrons per square centimeter, after which the device exhibits no single event upset and very little degradation in performance. In high radiation environments, current carrying capacity for bulk YBCO materials actually improve, while the current capacity of high quality thin films is affected little. This stems from the generation of additional pinning sites in bulk YBCO by the neutron bombardment, thus increasing the critical current density by up to three orders of magnitude. High quality thin films in their "as made" form already have large numbers of pinning sites, exhibit critical current densities at the level of $10^6$ A/cm$^2$, and thus are not significantly affected by radiation doses. Thus, the FSuFET memory device 10 would not be affected by high radiation doses.

The FSuFET device 10 has a static memory mode. The polarization state of the ferroelectric gate modulates the superconducting channel current. Therefore, the current-voltage curve of the FSuFET 10 reflects the two polarization states of the ferroelectric gate 16 which are defined as the "0" and "1" binary states. The memory effect of the FSuFET 10 stems from the static remanent polarization field of the ferroelectric gate 16 which does not change unless the gate is treated by a voltage pulse. The polarization state does not change for this device even when it is warmed to temperatures as high as 200° C. As a result, the state is still retained and can be directly read when the device is cooled to below the superconducting transition temperature. The direction of the polarization electric field induced by the ferroelectric gate 16 is normal to the direction of the channel in the superconductor layer 14. The direction of the polarization electric field can be switched by the application of a voltage pulse at the gate electrode 18. When a negative pulse of sufficient magnitude is applied at the gate electrode 18, the direction of the polarization electric field points out of the ferroelectric gate surface. This corresponds to the negative polarization of the ferroelectric gate 16. The drain-source current $I_{DS}$ measured in this case is the binary "0" state value. If a positive pulse of magnitude greater than the coercive field of the ferroelectric 16 is applied to the gate electrode 18, then the polarization of the ferroelectric gate 16 is reversed to point into the high $T_c$ superconductor surface. This corresponds to the positive polarization of the ferroelectric gate 16. The value of the current $I_{DS}$ in this condition represents the "1" state value. Switching pulse magnitude depends on the composition and the thickness of the ferroelectric gate 16 and can vary from 0.5 V to more than 100 V. The pulse width can be as short as 200 picoseconds and as long as 0.1 seconds depending on the required application.

Figure 7:
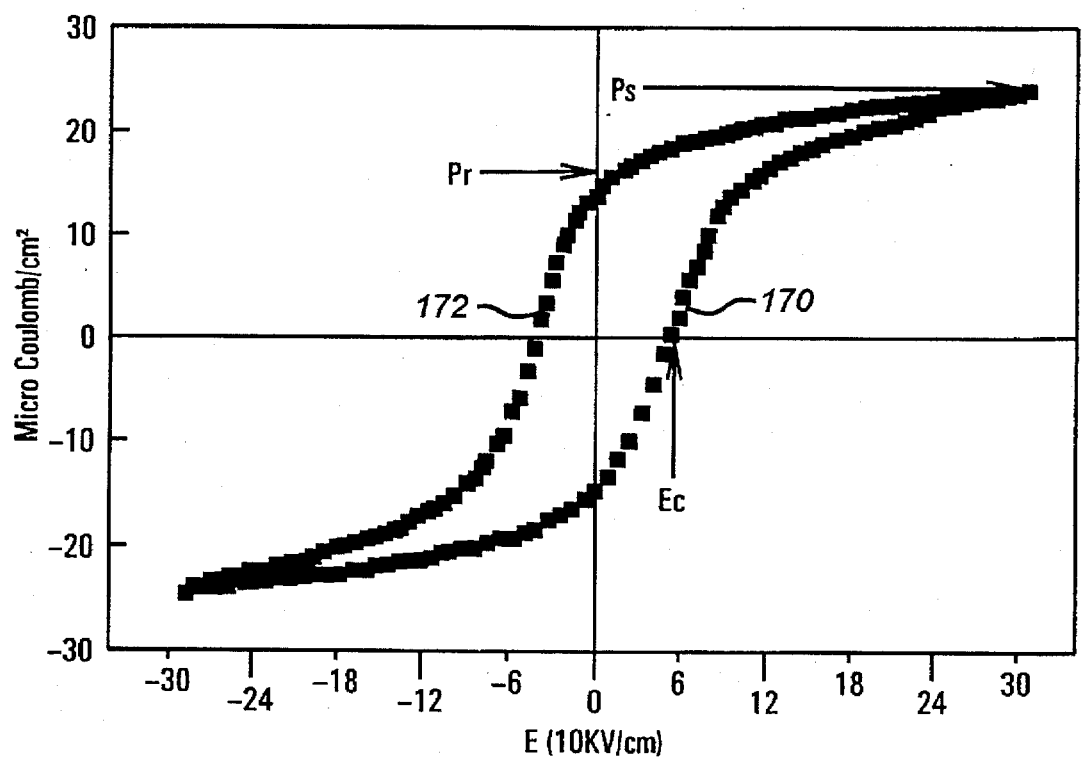
FIG. 7 is a graph illustrating the hysteresis behavior of the ferroelectric gate of the FSuFET of FIG. 1.

For the Au/PZT/YBCO structure, the remanent polarization ranges between 10 to 30 µC/cm$^2$ and the coercive field ranges between 20 kV/cm and 100 kV/cm. The ferroelectric gate 16 is characterized by hysteresis behavior, which is illustrated by the graph in FIG. 7. The hysteresis graph shows the relationship between the applied electric field and the polarization value. Curve 170 shows the electric field strength needed to switch the polarization state from the negative state to the positive state. Curve 172 shows the electric field strength needed to switch the polarization state in the opposite direction.

Figure 5:
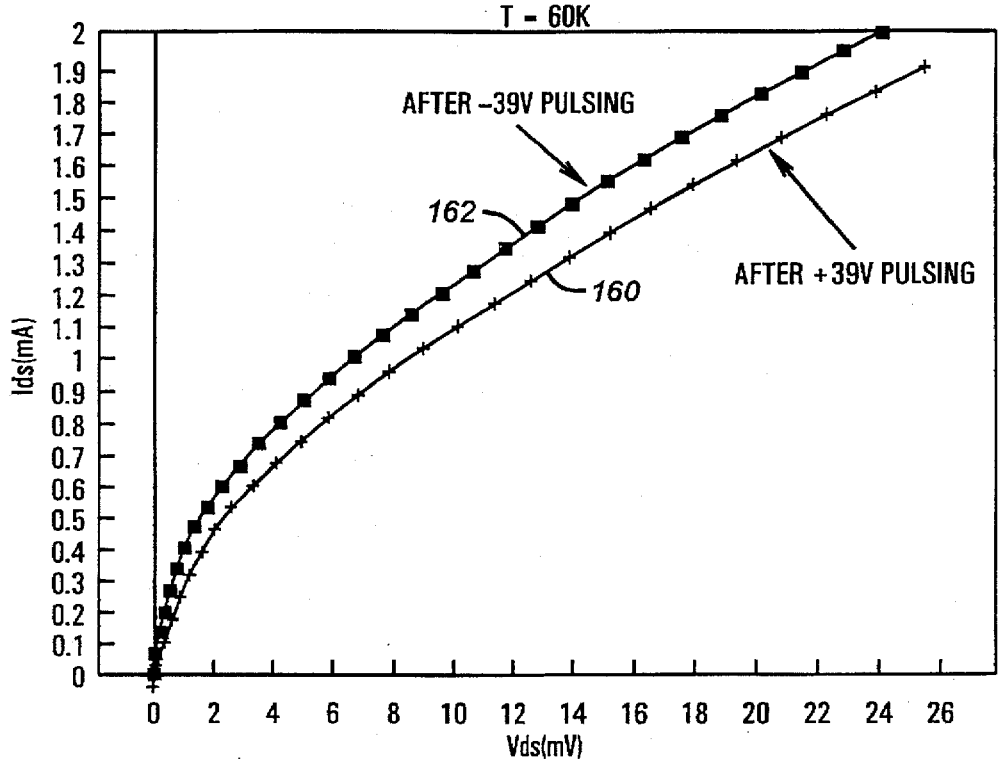
FIG. 5 is a graph illustrating the relationship between the drain-source current and drain-source voltage of the FSuFET of FIG. 1 terminal device under different gate voltages.
Figure 6:
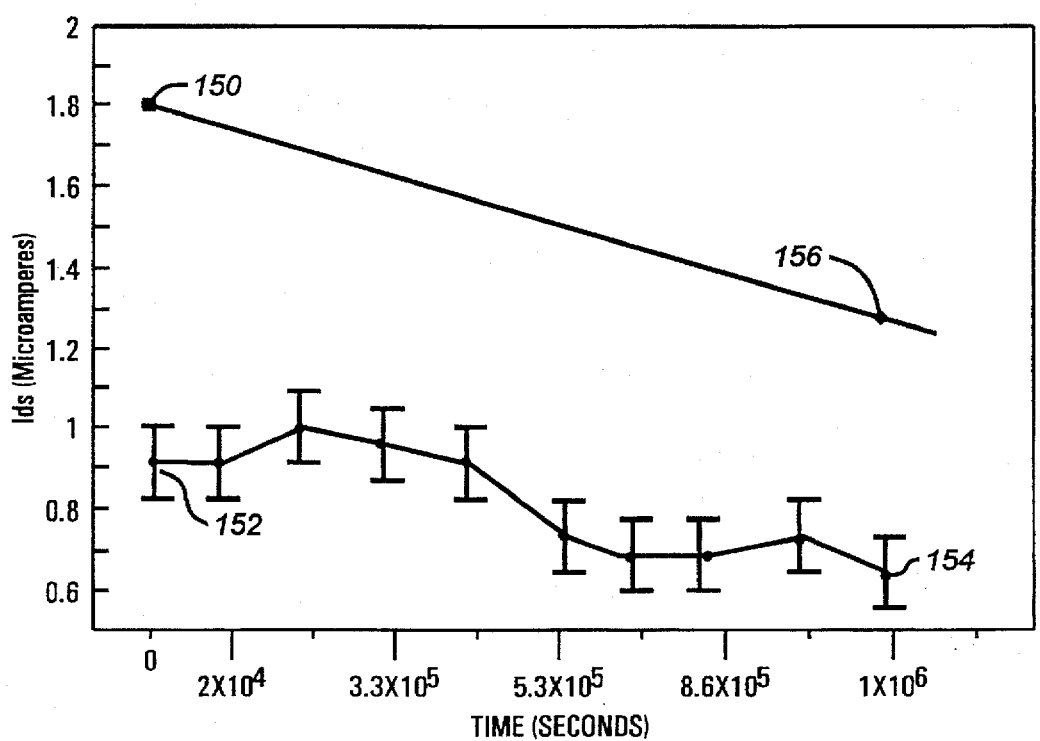
FIG. 6 is a graph illustrating the retention behavior of the FSuFET of FIG. 1.

The polarization of the ferroelectric gate 16 modulates the current flow through the drain-source channel, as best seen in FIG. 5. In tests performed on an actual thin film PZT/YBCO heterostructure FSuFET, a greater than 50% modulation effect has been obtained of the resistance of the high $T_c$ superconductor YBCO channel between the "on" and "off" state of the ferroelectric PZT gate. In FIG. 6, point 150 represents the magnitude of the current $I_{DS}$ in the drain-source channel when the drain output of the FSuFET 10 is in its OFF or "0" state. Point 152 represents the current $I_{DS}$ just after an input pulse of +70 volts has been applied to the gate electrode 18 of the FSuFET 10. Point 154 represents the value of the current $I_{DS}$ after $10^6$ seconds. It is contemplated that the retention time can go as high as $10^9$ seconds. There exists an approximately 30% fluctuation in the value of $I_{DS}$ over the period of time, which is believed to be due to temperature variations during the course of measurement. At point 154, a pulse of −70 volts is applied to the gate electrode 18, which switches the polarity of the ferroelectric gate 16 to the opposite direction. The value of the current $I_{DS}$ after the −70 volt pulse is represented by point 156. Again, the difference in value of $I_{DS}$ between points 150 and 156 is believed to be due to a change in temperature.

Referring to FIG. 5, a graph is shown illustrating the drain-source voltage $V_{DS}$ versus drain-source current $I_{DS}$ characteristic of the FSuFET 10. As shown in FIG. 2A, a DC voltage bias generated by a voltage source 204 is applied across the drain 22 and source 20 of the FSuFET 10, with the resulting current $I_{DS}$ measured by an ammeter 208. The voltage $V_{DS}$ is measured by a voltmeter 206. Thus, in the graph, the DC bias $V_{DS}$ is increased from 0 to 26 mV, with curves 160 and 162 representing the $I_{DS}$ behavior under different gate voltage conditions. Curve 160 represents the $V_{DS}$–$I_{DS}$ behavior after a +39 volt pulse is applied by a pulse generator 202 to the gate electrode 18. Curve 162 represents the $V_{DS}$–$I_{DS}$ behavior after a −39 volt pulse is applied to the gate electrode 18. At a $V_{DS}$ bias of about 24 mV, the difference in the drain-source current $I_{DS}$ resulting from the two different gate voltage pulses is approximately 0.2 mA. Thus, the modulation of the YBCO channel current by the polarization field of the ferroelectric gate 16, as obtained by $\Delta I_{DS}/I_{DS}$, is, for the tested device, approximately 25% in response to +39 and −39 volt gate pulsing. Thus, the FSuFET device 10 is non-volatile as a memory storage element which has a retention time of longer than $10^6$ seconds.

The other operation mode for the FSuFET 10 is the transient mode. To obtain test measurements, the FSuFET 10 is arranged in a circuit as shown in FIG. 2B. The gate of the FSuFET 10 is connected to a pulse generator, the drain is connected through a drain resistor 214 to a DC bias voltage source 212, and the source is connected through a source resistor 216 to ground. An oscilloscope 218 is connected to the drain to take pulse measurements. A 16-V peak-to-peak pulse of 10 µs duration is applied to the ferroelectric gate 16, with a 10 mV bias voltage applied by the source 212. The applied pulse results in a flow of switching charge through the high $T_c$ superconducting layer. The nonlinear ferroelectric switching current switches the superconducting channel which causes a significant change in the drain output. This charge flow lasts less than 100 ns for a typical ferroelectric PZT gate. There are four possible transient drain output states for the ferroelectric three-terminal device 10:

1) Positive pulse, output high
2) Positive pulse, output low
3) Negative pulse, output high
4) Negative pulse, output low.

The four possible states are illustrated in FIG. 3, which shows the drain response to an external pulse. Before application of the external pulse, the ferroelectric gate 16 was in the negative polarization state. If the ferroelectric gate 16 had been in the positive state, application of the external positive pulse would not have resulted in generation of the transient pulses. The high voltage pulses are generated when the drain-source channel is superconducting, while the low voltage pulses are generated when the drain-source channel is non-superconducting (normal). If the ferroelectric gate 16 had been in the positive polarization state, then a negative pulse would have to be applied to generate the transient pulses. In that case, the first pulse would have been negative and the second pulse would have been positive.

The curve indicated as numeral 100 was generated at an operating temperature of 264° Kelvin, which is above $T_c$, and the curve indicated as numeral 102 was generated at a temperature of 45° Kelvin, which is below $T_c$. Thus, depending on the state of polarization of the perovskite ferroelectric gate 16 and the normal or superconducting state of the drain-source channel, four logic states can be produced by the FSuFET device 10.

Changing the polarization of the ferroelectric gate 16 can be done directly and rapidly via a voltage pulse. Changing the superconducting state of the drain-source channel may be accomplished in one of several different ways. In one approach, the transient current generated in the high $T_c$ superconducting layer 14 in response to the switch in the polarization of the ferroelectric gate 16 can be used to switch the superconducting state. If the transient current density plus the drain-source bias current density is higher than the critical current density of the superconducting channel, the channel is switched from the superconducting state to the normal state. The measured critical current density of the YBCO channel is approximately $2.7\times10^5$ A/cm$^2$. The drain-source bias current density can be varied by adjusting the DC biasing of the circuit connected to the FSuFET 10. Alternatively, a voltage pulse synchronized to the gate voltage pulse can be applied to the drain or source to generate the desired bias current. The amount of bias current needed can be adjusted by changing the dimensions of the YBCO channel, i.e., by changing the cross-sectional area of the drain-source channel which affects the current density, or by using different $T_c$ YBCO to adjust the critical current density.

Figure 4:
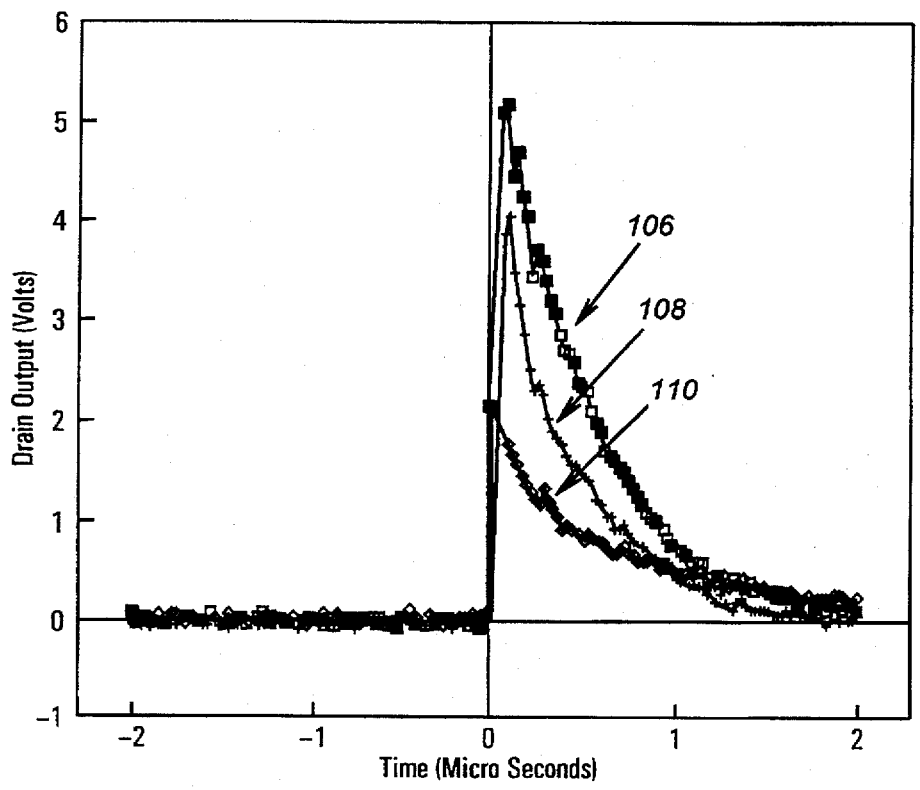
FIG. 4 is a graph illustrating the switching behavior of the FSuFET of FIG. 1 with different drain-source bias current densities.

Referring to FIG. 4, three curves 106, 108 and 110 are shown illustrating the drain output voltage at different biasing currents. The drain output voltage was obtained at a temperature of 55° Kelvin. The curve designated by numeral 106 was obtained with a channel biasing current density of 7 A/cm$^2$, while the curves designated by numerals 108 and 110 were obtained with biasing current densities of $7.5\times10^4$ A/cm$^2$ and $1.7\times10^5$ A/cm$^2$, respectively.

Another possible method of switching the superconductive state of the drain-source channel is by increasing the external magnetic field such that, combined with the transient current density, the superconducting channel will become normal. The third method of changing the channel superconducting state is by raising the operating temperature of the FSuFET 10 to above Tc. However, this last method is undesirable due to the length of time required to change temperature.

Thus, a three-terminal non-volatile ferroelectric/superconductor thin film field effect transistor (FSuFET) has been described. The FSuFET is used as a non-volatile memory storage device that provides two static states and four transient states. The FSuFET includes a superconducting film epitaxially grown on a substrate layer. A ferroelectric thin film is then epitaxially grown on the superconducting layer to form the gate of the FSuFET. A drain electrode and a source electrode are then contacted to the superconducting film on either side of the ferroelectric gate. In static mode, the two polarization states of the ferroelectric gate correspond to the binary "0" and "1" states, which are switched by applying a voltage pulse of sufficient magnitude. In transient mode, the four states depend upon the polarization state of the ferroelectric gate and the conductive state (superconducting or non-superconducting) of the drain-source channel. The four states are generated at the drain of the FSuFET and consist of a positive, high pulse; a positive, low pulse; a negative, high pulse; and a negative, low pulse.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A non-volatile memory device, comprising:

a base comprising a thin film superconductor layer having a high critical temperature, a thickness of at least 10 nm, and a top surface;

a thin film ferroelectric layer epitaxially deposited on said superconductor top surface, said ferroelectric layer having a first and second polarization state;

a gate electrode contacted to said ferroelectric layer;

a source electrode contacted to said superconductor top surface on a first side of said ferroelectric layer; and a drain electrode contacted to said superconductor top surface on a second opposite side of said ferroelectric layer, wherein a channel region is formed in said superconductor layer under said ferroelectric layer and between said drain and source electrodes, said channel region having a resistivity that is modulated by said ferroelectric layer polarization states, wherein said ferroelectric layer being at a first polarization state causes said channel region to have a first resistivity, wherein said ferroelectric layer being at a second polarization state causes said channel region to have a second resistivity that is less than said first resistivity, wherein said ferroelectric layer retains its polarization state, and wherein said polarization state is switchable between said first and second polarization states in response to an external voltage pulse applied at said gate electrode.

2. The non-volatile memory device of claim 1, wherein said second resistivity is at least 5% less than said first resistivity.

3. The non-volatile memory device of claim 1, wherein said second resistivity is at least 25% less than said first resistivity.

4. The non-volatile memory device of claim 1, wherein said ferroelectric layer retains its polarization state for at least $10^6$ seconds.

5. The non-volatile memory device of claim 1, wherein said ferroelectric layer has a thickness of at least 30 nm.

6. The non-volatile memory device of claim 1, wherein said superconductor layer comprises a perovskite oxide.

7. The non-volatile memory device of claim 6, wherein said superconductor layer comprises $YBa_2Cu_3O_{7-x}$.

8. The non-volatile memory device of claim 1, wherein said base further includes a substrate over which said superconductor layer is epitaxially deposited.

9. The non-volatile memory device of claim 8, wherein said substrate comprises a perovskite oxide.

10. The non-volatile memory device of claim 9, wherein said substrate comprises a compound selected from the group of compounds consisting of MgO, $LaAlO_3$, $SrTiO_3$, and $NdGaO_3$.

11. The non-volatile memory device of claim 9, wherein said substrate comprises a lower layer and a buffer layer, said buffer layer comprising a thin perovskite oxide and said lower layer comprising a compound selected from the group of compounds and elements consisting of Si, Ge, InP, and GaAs.

12. The non-volatile memory device of claim 1, wherein said ferroelectric layer is a perovskite oxide with a polarization direction normal to the substrate.

13. The non-volatile memory device of claim 12, wherein said ferroelectric layer comprises a compound selected from the group consisting of $PbZrTiO_3$, $(Pb,La)(Zr,Ti)O_3$, and $BaSrTiO_3$.

14. The non-volatile memory device of claim 13, wherein said ferroelectric layer comprises $PbZr_{0.52}Ti_{0.48}O_3$.

15. The non-volatile memory device of claim 13, wherein said ferroelectric layer has a thickness of at least 30 nm.

16. The non-volatile memory device of claim 1, wherein said channel region in said superconductor layer is switchable between a superconductive state and a normal state.

17. The non-volatile memory device of claim 16, wherein said superconductor layer has a critical current density, wherein a bias current having a first density is applied through said channel region, wherein a voltage pulse applied at said gate electrode causes a transient current having a second density to be produced in said channel region, said superconductor layer being switched from said superconductive state to said normal state if the sum of said first density and said second density exceeds said critical current density.

18. The non-volatile memory device of claim 17, wherein one of four states can be generated at said drain electrode in response to said voltage pulse, said one of four states being dependent upon said polarization state of said ferroelectric layer and whether said superconductive layer is in said superconductive or normal state.

19. The non-volatile memory device of claim 18, wherein said four states are represented as a positive, high pulse signal; a positive, low pulse signal; a negative, high pulse signal; and a negative, low pulse signal.

20. The non-volatile memory device of claim 1, wherein switching said ferroelectric layer polarization state between said first state and said second state is characterized by hysteresis.

21. The non-volatile memory device of claim 20, wherein said external voltage pulse must have a magnitude of greater than or equal to approximately 0.5 volts to switch from said second polarization state to said first polarization state.

22. The non-volatile memory device of claim 21, wherein said external voltage pulse must have a magnitude of less than or equal to approximately −0.5 volts to switch from said first polarization state to said second polarization state.

* * * * *